(12) United States Patent
Kajimoto

(10) Patent No.: US 6,621,329 B2
(45) Date of Patent: Sep. 16, 2003

(54) SEMICONDUCTOR DEVICE

(75) Inventor: Takeshi Kajimoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/134,428

(22) Filed: Apr. 30, 2002

(65) Prior Publication Data
US 2003/0080717 A1 May 1, 2003

(30) Foreign Application Priority Data

Nov. 1, 2001 (JP) ........................................ 2001-336161

(51) Int. Cl.$^7$ ................................................ G05F 1/10
(52) U.S. Cl. ........................................ 327/540; 327/544
(58) Field of Search ........................ 326/80, 81; 327/319, 327/333, 538, 540, 541, 544

(56) References Cited

U.S. PATENT DOCUMENTS 5,557,193 A    9/1996  Kajimoto ..................... 323/282
5,933,026 A  * 8/1999  Larsen et al. .................. 326/81

FOREIGN PATENT DOCUMENTS

| JP | 59-160219 | 9/1984 | ............. G05F/1/56 |
| JP | 2000-68813 | 3/2000 | ....... H03K/19/0175 |
| JP | 3085562 | 7/2000 | ......... G11C/11/407 |

OTHER PUBLICATIONS

Horiguchi, et al, "A Tunable CMOS–DRAM Voltage Limiter with Stabilized Feedback Amplifier" IEEE Journal of Solid–State Circuits, vol. 25, Oct. 1990, pp. 1129–1135.

* cited by examiner

Primary Examiner—Jeffrey Zweizig
(74) Attorney, Agent, or Firm—McDermott, Will & Emery

(57) ABSTRACT

An external voltage is supplied to a power terminal of a semiconductor chip and is applied to a semiconductor circuit and a regulator circuit. An output control signal is supplied from semiconductor circuit to an output circuit. According to an RD signal output from semiconductor circuit, regulator circuit applies an output voltage obtained by decreasing external voltage to output circuit, thereby enabling power source noise caused in association with the operation of output circuit to be absorbed by regulator circuit without adding an external power terminal dedicated to output circuit.

19 Claims, 9 Drawing Sheets

SEMICONDUCTOR DEVICE

BACKGROUND OF THE INVENTION

1. Field of the Invention

The present invention relates to a semiconductor device. More particularly, the invention relates to a semiconductor device intended to realize high-speed low-power-consuming operation and to assure noise immunity by applying a voltage lower than a source voltage of a semiconductor chip to an output circuit.

2. Description of the Background Art

FIG. 13 is a schematic block diagram of a conventional semiconductor chip. In FIG. 13, a semiconductor chip 1 has therein a semiconductor circuit 11 such as a semiconductor memory or semiconductor logic and an output circuit 12. An output control signal is supplied from semiconductor circuit 11 to output circuit 12. In such a semiconductor chip 1, in order to avoid an influence of noise caused in association with an output operation of output circuit 12, in many cases, besides a power terminal to which a source voltage VDD of semiconductor chip 1 is supplied, a power terminal to which a source voltage VDDQ dedicated to output circuit 12 is provided.

When the processing speed of the semiconductor device is increased to address a demand of higher processing speed of recent years, the number of switching times between the "H" level and the "L" level increases. Consequently, power consumption increases from the relation of a voltage changed×the number of changes. To reduce power consumption, the amplitude of an output signal of output circuit 12 has to be decreased. For this purpose, as the source voltage of output circuit 12, a source voltage different from and lower than that of semiconductor circuit 11 such as a memory circuit or logic circuit has to be separately supplied from a power terminal.

However, even when a power terminal dedicated to the output circuit is provided, at the time of mounting the device onto a system, due to limitation on the number of power source layers of a mounting substrate and the like, particularly in a semiconductor memory, the power terminal is often connected to the same power source.

It is difficult to apply a voltage different from and lower than a source voltage of semiconductor chip 1 body to the power terminal dedicated to the output circuit in order to decrease the output amplitude also due to the limitation on the number of layers of a mounting substrate.

SUMMARY OF THE INVENTION

It is therefore an object of the invention to provide a semiconductor device capable of performing high-speed operation and outputting an output signal of a small amplitude without providing a power terminal for an output circuit.

The invention provides, briefly, a semiconductor device including an output circuit, having: a semiconductor circuit for supplying an output control signal to the output circuit; a power terminal to which a source voltage to be applied to the semiconductor circuit is supplied from the outside; and a power circuit for dividing an output voltage obtained by decreasing the source voltage to be supplied to the power terminal, setting the output voltage to a predetermined source potential lower than the source voltage supplied from the outside by controlling on-state resistance of a transistor for control by using a potential difference between the voltage obtained by the dividing operation and the output voltage, and supplying the predetermined source potential to the output circuit.

Therefore, according to the invention, without adding an external power terminal dedicated to the output circuit, power source noise caused in association with the operation of the output circuit can be absorbed by the power circuit, and the small-amplitude and high-speed interface can be realized.

The power circuit includes a switching transistor for supplying the predetermined source potential lower than the source voltage to the output circuit in accordance with an active signal supplied from the semiconductor circuit.

The invention also provides a semiconductor device including an output circuit, having: a semiconductor circuit for supplying an output control signal to the output circuit; a power terminal to which a source voltage to be applied to the semiconductor circuit and the output circuit is supplied from the outside; a ground terminal connected to an external ground potential; and a power circuit for generating a divided voltage on the basis of an output ground potential higher than the external ground potential, setting the output ground potential to a predetermined ground potential higher than the external ground potential by controlling on-resistance of a transistor for control by using a potential difference between the divided voltage and the output ground potential.

The power circuit includes a switching transistor for supplying the predetermined ground potential higher than the external ground potential to the output circuit in accordance with an active signal supplied from the semiconductor circuit.

Further, there is also provided a semiconductor device including an output circuit, having: a semiconductor circuit for supplying an output control signal to the output circuit; a power terminal to which a source voltage to be applied to the semiconductor circuit is supplied from the outside; and a power circuit including a comparing circuit for comparing an output potential to be applied to the output circuit with a predetermined reference potential, and a drive transistor for controlling the output potential to be a predetermined potential lower than the source voltage applied to the power terminal in accordance with a comparison output of the comparing circuit.

The power circuit may include a switching transistor for supplying the predetermined source potential lower than the source voltage to the output circuit in accordance with an active signal supplied from the semiconductor circuit.

Further, there is also provided a semiconductor device including an output circuit, having: a semiconductor circuit for supplying an output control signal to the output circuit; a power terminal to which a source voltage to be applied to the semiconductor circuit and the output circuit is supplied from the outside; a ground terminal connected to an external ground potential; and a power circuit including a comparing circuit for comparing an output ground potential to be applied to the output circuit with a predetermined reference potential, and a drive transistor for controlling the output ground potential to be a predetermined potential higher than a ground potential of the ground terminal in accordance with a comparison output of the comparing circuit.

The power circuit may include a switching transistor for supplying a predetermined ground potential higher than the ground potential of the ground terminal to the output circuit in accordance with an active signal supplied from the semiconductor circuit.

Further, a plurality of the output circuits may be provided, and the drive transistor of the power circuit is provided in correspondence with each of the output circuits.

Further, the comparison output is supplied to an input electrode of the drive transistor, the source voltage is applied to a first electrode of the drive transistor, and the output voltage is output from a second electrode of the drive transistor and applied to the output circuit, and the semiconductor device further includes: a feedback capacitor connected between the input electrode and the second electrode of the drive transistor; a first resistor connected between the input electrode of the drive transistor and the comparison output; and a second resistor connected between the second electrode of the drive transistor and a comparison input of the comparing circuit.

As the reference potential, a reference potential for an input signal may be used.

Further, a voltage dividing resistor for dividing a signal to be supplied to a comparison input of the comparing circuit via the second resistor is provided.

Further, a plurality of semiconductor chips each including the semiconductor circuit and the output circuit are arranged, and the power circuit is provided commonly for the plurality of semiconductor chips.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
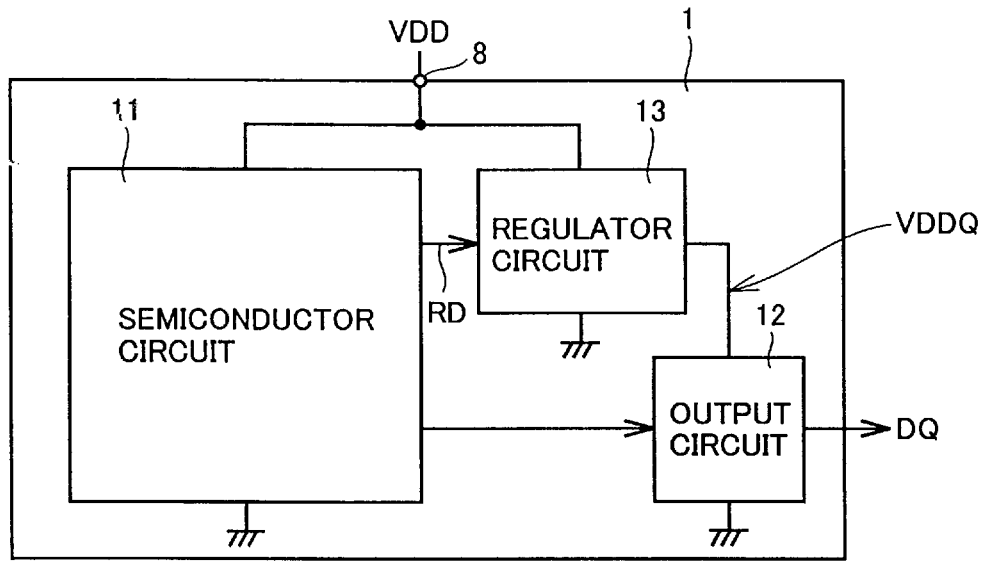
FIG. 1 is a block diagram showing the configuration of a semiconductor chip in a first embodiment of the invention.

FIG. 1 is a block diagram showing the configuration of a semiconductor chip in a first embodiment of the invention.

In FIG. 1, a semiconductor chip 1 includes a power terminal 8, a semiconductor circuit 11, an output circuit 12, and a regulator circuit 13. To power terminal 8, an external voltage VDD of, for example, 2.5V is supplied. This external voltage VDD is applied to semiconductor circuit 11 and regulator circuit 13. Semiconductor circuit 11 is, for example, a semiconductor memory and an output control signal is supplied from semiconductor circuit 11 to output circuit 12.

Regulator circuit 13 applies an output voltage VDDQ obtained by decreasing external voltage VDD to 1.8V to output circuit 12 in accordance with an RD signal (read start signal) as an activate signal output from semiconductor circuit 11. The RD signal is used as a control signal of regulator circuit 13 for the following reasons. If an OE signal (output start signal) is used, time up to start of output is not sufficient and a stable regulating operation is not expected. When the RD signal is inverted, output voltage VDDQ supplied from regulator circuit 13 to output circuit 12 is interrupted, so that a leak current can be prevented from being passed to output circuit 12.

Figure 2:
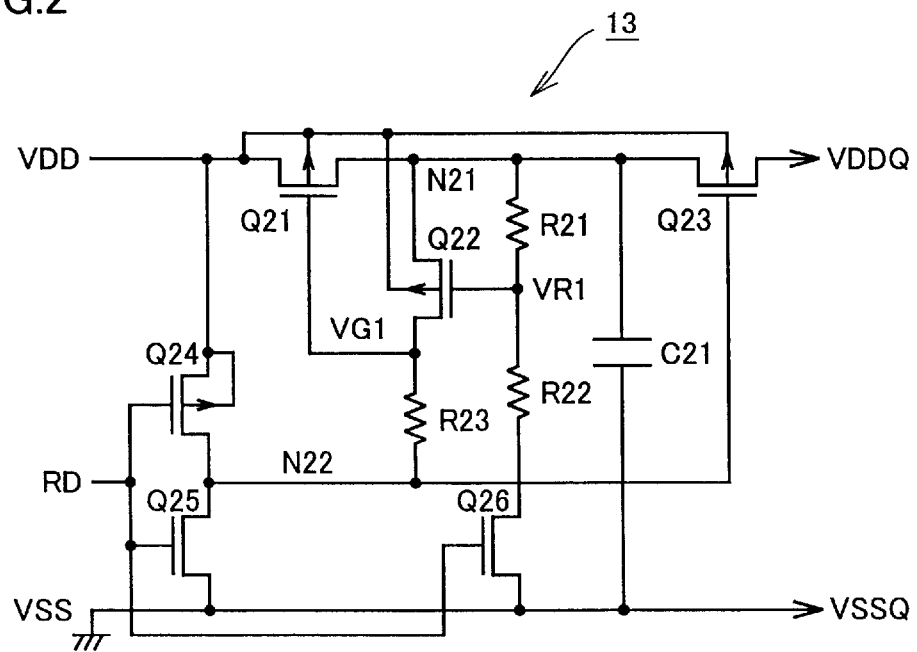
FIG. 2 is a concrete circuit diagram of a regulator circuit 13 shown in FIG. 1.

FIG. 2 is a concrete circuit diagram of regulator circuit 13 shown in FIG. 1. In FIG. 2, external voltage VDD is applied to the source of each of PMOS transistors Q21 and Q24, and a substrate potential is applied from external voltage VDD to PMOS transistors Q21, Q22, Q23, and Q24. To the gate of each of PMOS transistor Q24 and NMOS transistors Q25 and Q26, the RD signal is supplied from semiconductor circuit 11. The drain of PMOS transistor Q24, the drain of NMOS transistor Q25, and the gate of PMOS transistor Q23 are connected to a node N22. The source of each of NMOS transistors Q25 and Q26 is connected to a line of ground voltage VSS.

The drain of PMOS transistor Q21 and sources of PMOS transistors Q22 and Q23 are connected to a node N21. Between node N21 and the line of ground voltage VSS, a capacitor C21 is connected and also resistors R21 and R22 and NMOS transistor Q26 are connected in series. Between the drain of PMOS transistor Q22 and node N22, a resistor R23 is connected. A reference voltage VR1 obtained by dividing operation of resistors R21 and R22 is supplied to the gate of PMOS transistor Q22, and a gate voltage VG1 obtained by dividing operation of PMOS transistor Q22 and resistor R23 is applied to the gate of PMOS transistor Q21.

A concrete operation of regulator circuit 13 will now be described. When the RD signal is at the "L" level and a standby state is set, PMOS transistor Q24 is turned on, NMOS transistors Q25 and Q26 are turned off, and node N22 and gate voltage VG1 become at the VDD level, so that PMOS transistors Q21 and Q23 are turned off. In such a manner, external voltage VDD and power source output from capacitor C21 are interrupted. The reason why NMOS transistor Q26 is provided separately from NMOS transistor Q25 is that node N21 and reference voltage VR1 are not excessively charged by node N22. When a threshold voltage of PMOS transistor Q22 is VTH, if VDDQ is lower than VDD−VTH (VDDQ<VDD−VTH), node N21 and reference voltage VR1 are charged to VDD−VTH via PMOS transistor Q22.

When the RD signal becomes the "H" level and an operating state is obtained, NMOS transistors Q25 and Q26 are turned on, node N22, gate voltage VG1, and reference voltage VR1 decrease to a predetermined potential, PMOS transistors Q21 and Q23 are turned on, and an operation of the regulator is started. Specifically, since reference voltage VR1 obtained by dividing output voltage VDDQ by resistors R21 and R22 is applied to the gate of PMOS transistor Q22, when output voltage VDDQ increases, the potential difference (|VGS| of PMOS transistor Q22) between output voltage VDDQ and reference voltage VR1 also increases, on-state resistance of PMOS transistor Q22 decreases, and gate voltage VG1 of PMOS transistor Q21 rises. Consequently, the on-state resistance of PMOS transistor Q21 increases, and output voltage VDDQ decreases.

Similarly, when output voltage VDDQ decreases, |VGS| of PMOS transistor Q22 decreases and the on-resistance of PMOS transistor increases. Consequently, gate voltage VG1 of PMOS transistor Q21 decreases, the on-state resistance of PMOS transistor Q21 decreases, and output voltage VDDQ increases. By the series of operations, the operation of the voltage regulator is realized. The operation of the voltage regulator is specifically described in, for example, Japanese Patent Laying-Open No. 59-160219(1984).

By providing the regulator circuit 13 and applying output voltage VDDQ lower than external voltage VDD to output circuit 12, without adding an external power terminal dedicated to output circuit 12, power source noise caused in association with the operation of output circuit 12 can be absorbed by regulator circuit 13, and the small-amplitude and high-speed interface can be realized.

Figure 3:
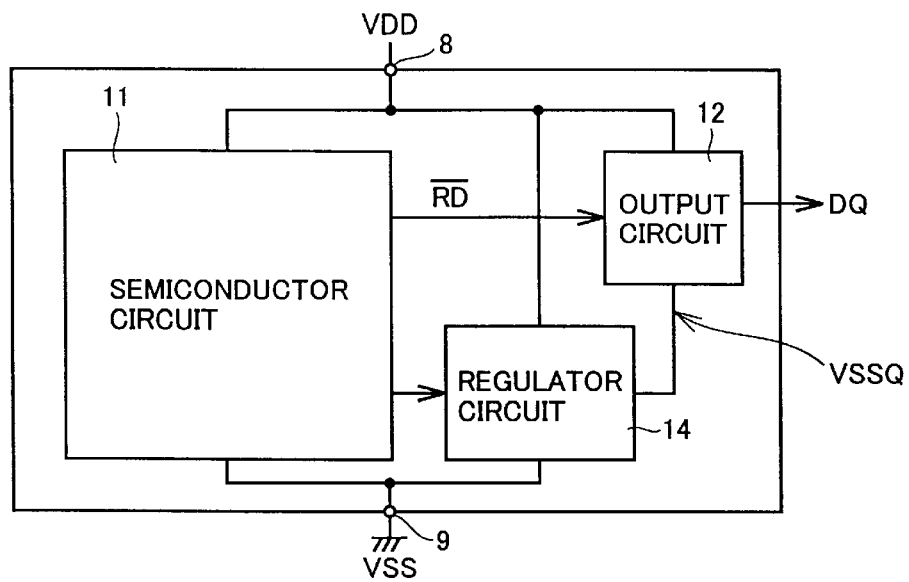
FIG. 3 is a block diagram showing the configuration of a semiconductor chip in a second embodiment of the invention.

FIG. 3 is a block diagram showing the configuration of a semiconductor chip in a second embodiment of the invention. In the embodiment shown in FIG. 1, regulator circuit 13 is provided in semiconductor chip 1 in order to obtain output voltage VDDQ by decreasing external voltage VDD. In contrast, in the embodiment shown in FIG. 3, a regulator circuit 14 connected to the line of ground voltage VSS of power terminal 9 is provided in semiconductor chip 1 and output voltage VSSQ of regulator circuit 14 is supplied to output circuit 12.

Figure 4:
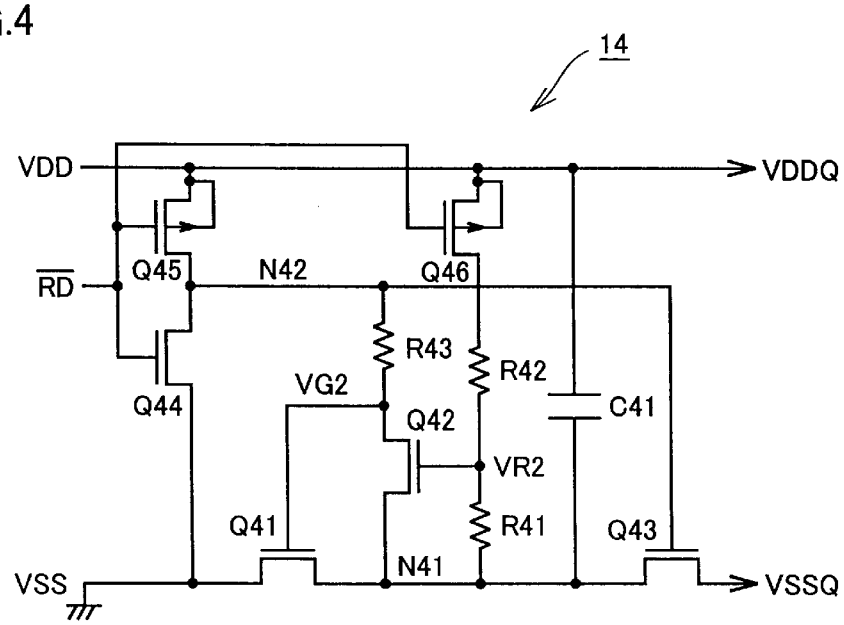
FIG. 4 is a concrete circuit diagram of a regulator circuit 14 shown in FIG. 3.

FIG. 4 is a concrete circuit diagram of regulator circuit 14 shown in FIG. 3. In FIG. 4, external voltage VDD is applied to the source of each of PMOS transistors Q45 and Q46. An inversion signal of an RD signal is supplied to the gate of each of PMOS transistors Q45 and Q46 and an NMOS transistor Q44. The external voltage is applied as a substrate potential to PMOS transistors Q45 and Q46. The drain of PMOS transistor Q45, the drain of NMOS transistor Q44 and the gate of an NMOS transistor Q43 are connected to a node N42.

The source of NMOS transistor Q44 and that of an NMOS transistor Q41 is connected to the line of ground voltage VSS. The drain of NMOS transistor Q41 and the source of NMOS transistor Q43 are connected to a node N41. An output voltage VSSQ is output from the drain of NMOS transistor Q43. Between external voltage VDD and node N41, a capacitor C41 is connected and PMOS transistor Q46 and resistors R42 and R41 are connected in series. A reference voltage VR2 obtained by dividing operation of resistors R41 and R42 is applied to the gate of an NMOS transistor Q42. Between nodes N42 and N41, a resistor R43 and NMOS transistor Q42 are connected in series. A gate voltage VG2 at the connection point of nodes N42 and N41 is applied to the gate of NMOS transistor Q41.

Concrete operations of regulator circuit 14 shown in FIG. 4 will now be described. When the inversion signal of the RD signal is at the "H" level and the standby state is obtained, PMOS transistors Q45 and Q46 are turned off and NMOS transistor Q44 is turned on. Consequently, node N42 and gate voltage VG2 become at the VSS level and NMOS transistors Q41 and Q43 are turned off. In such a manner, external voltage VSS and a power output from capacitor C41 are interrupted.

When the inversion signal of the RD signal becomes the "L" level and an operation state is obtained, PMOS transistors Q45 and Q46 are turned on, node N42, gate voltage VG2, and reference voltage VR2 increase to a predetermined potential, NMOS transistors Q41 and Q43 are turned on, and operations of the regulator are started. That is, since reference voltage VR2 obtained by dividing output voltage VSSQ by resistors R41 and R42 is applied to the gate of NMOS transistor Q42, when output voltage VSSQ increases, the potential difference (|VGS| of NMOS transistor Q42) between output voltage VSSQ and reference voltage VR2 decreases, on-state resistance of NMOS transistor Q42 increases, and gate voltage VG2 of NMOS transistor Q41 increases. Consequently, the on-state resistance of NMOS transistor Q41 decreases, and output voltage VSSQ decreases.

Similarly, when output voltage VSSQ decreases, |VGS| of NMOS transistor Q42 increases, and on-state resistance of NMOS transistor Q42 decreases. Consequently, gate voltage VG2 of NMOS transistor Q41 decreases, on-state resistance of NMOS transistor Q41 increases, and output voltage VSSQ rises. By the series of operations, the operation of the voltage regulator is realized. Thus, without adding an external VSSQ terminal dedicated to output circuit 12, VSS noise caused in association with the operation of output circuit 12 can be absorbed by regulator circuit 14, and the small-amplitude and high-speed interface can be realized.

Although not shown, by using both regulator circuit 13 on the VDD side shown in FIG. 2 and regulator circuit 14 on the VSS side shown in FIG. 4, generating VDDQ and VSSQ, and supplying VDDQ and VSSQ to output circuit 12, without adding a power terminal and a VSS terminal dedicated to the output circuit, power source noise and VSS noise caused in association with operation of output circuit 12 can be absorbed by regulator circuits 13 and 14, and a voltage lower than source voltage VDD of semiconductor chip 1 body and a voltage higher than ground voltage VSS can be supplied to output circuit 12. Thus, the small-amplitude and high-speed interface can be realized.

Figure 5:
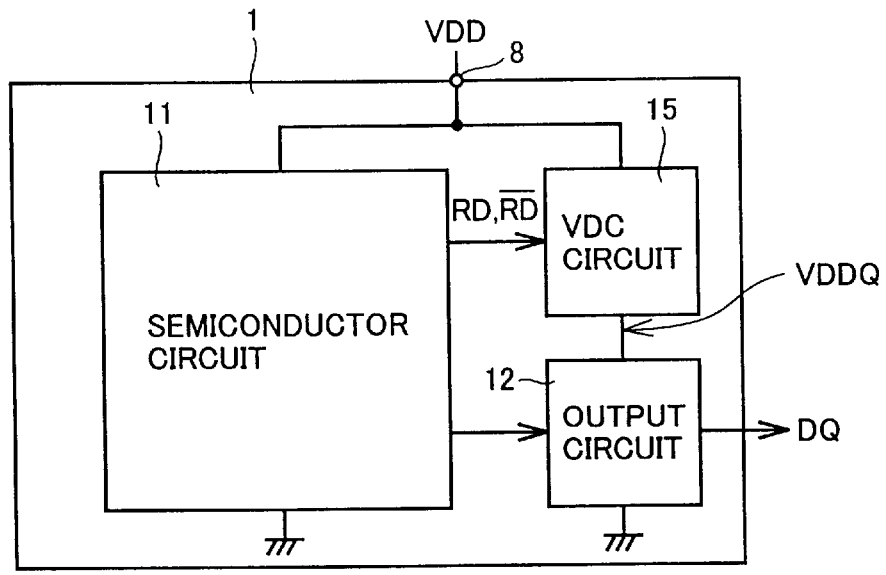
FIG. 5 is a block diagram showing a semiconductor chip in a third embodiment of the invention.

FIG. 5 is a block diagram showing a semiconductor chip in a third embodiment of the invention. In the embodiment shown in FIG. 1, output voltage VDDQ is generated from external voltage VDD by regulator circuit 13. In the third embodiment, an output voltage VDDQ is generated from external voltage VDD by using a VDC (Voltage Down Converter) circuit 15. VDC circuit 15 is described in, for example, IEEE Journal of Solid-State Circuits, Vol. 25, October 1990, p 1129 to 1135.

Figure 6:
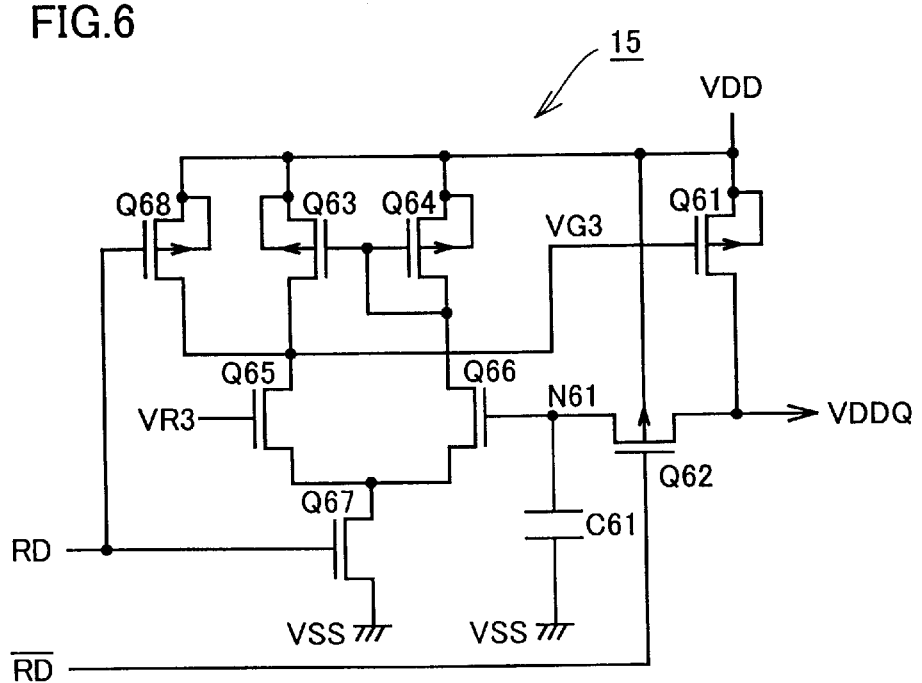
FIG. 6 is a concrete circuit diagram of a VDC circuit 15 shown in FIG. 5.

FIG. 6 is a concrete circuit diagram of VDC circuit 15 of FIG. 5. In FIG. 6, external voltage VDD is applied to the source of each of PMOS transistors Q61, Q63, Q64, and Q68 and is supplied as a substrate potential to these PMOS transistors. The substrate potential is also supplied to a PMOS transistor Q62. PMOS transistor Q61 takes the form of a drive transistor.

PMOS transistors Q63 and Q64 and NMOS transistors Q65 to Q67 construct a differential amplifier. The gates of PMOS transistors Q63 and Q64, the drain of PMOS transistor Q64, and the drain of NMOS transistor Q66 are connected to each other. The drain of PMOS transistor Q63 and the drain of NMOS transistor Q65 are connected to each other. The sources of NMOS transistors Q65 and Q66 and the drain of NMOS transistor Q67 are connected to each other, and the source of NMOS transistor Q67 is connected to the VSS voltage.

The drain of PMOS transistor Q68, the drain of NMOS transistor Q65, and the gate of PMOS transistor Q61 are connected to each other, and the RD signal is supplied to the gates of NMOS transistor Q67 and PMOS transistor Q65. A predetermined reference voltage VR3 is given to the gate of NMOS transistor Q65. Although not shown, reference voltage VR3 is generated by dividing a voltage by resistors in a manner similar to FIG. 2. To suppress power consumption of a differential amplifier, the RD signal is supplied to the gate of NMOS transistor Q67, thereby controlling the active/inactive state of the differential amplifier.

The gate of NMOS transistor Q66 and the source of PMOS transistor Q62 are connected to a node N61, and a capacitor C61 is connected between node N61 and the line of ground voltage VSS. An inversion signal of the RD signal is input to the gate of PMOS transistor Q62. The drains of PMOS transistors Q61 and Q62 are commonly connected to each other, and an output voltage VDDQ is taken out.

A concrete operation of VDC circuit 15 shown in FIG. 6 will now be described. When the RD signal is at the "L" level, its inversion signal is at the "H" level, and a standby state is obtained, PMOS transistor Q68 is turned on, a gate voltage VG3 becomes at the VDD level, PMOS transistor Q61 is turned off, and deriving of output voltage VDDQ from external voltage VDD is interrupted. Simultaneously, the inversion signal of the RD signal goes high ("H" level), so that PMOS transistor Q62 is also turned off, and discharging of charges accumulated in capacitor C61 is also interrupted.

When the RD signal is at the "H" level, the inversion signal of the RD signal is at the "L" level, and an operating state is obtained, NMOS transistor Q67 is turned on and PMOS transistor Q62 is also turned on. A predetermined reference voltage VR3 and output voltage VDDQ are compared with each other by the differential amplifier constructed by PMOS transistors Q63 and Q64 and NMOS transistors Q65 to Q67. When output voltage VDDQ increases, gate voltage VG3 of PMOS transistor Q61 is increased. When output voltage VDDQ decreases, gate voltage VG3 is decreased. In such a manner, a feedback operation is realized so that the original potential is maintained at which output voltage VDDQ is always equal to reference voltage VR3.

By constructing semiconductor chip 1 by using VDC circuit 15 as described above, without adding an external source terminal dedicated to the output circuit, power source noise caused in association with the operation of output circuit 12 can be absorbed by the voltage retaining characteristic of VDC circuit 15, and a voltage lower than the source voltage of semiconductor chip 1 body can be supplied to output circuit 12. Thus, the small-amplitude and high-speed interface can be realized.

Figure 7:
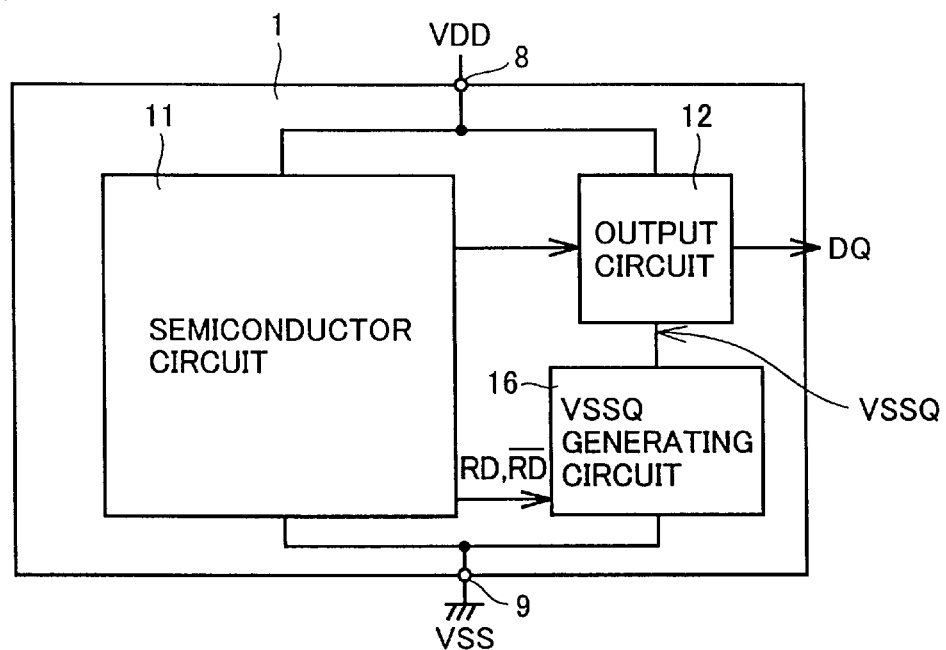
FIG. 7 is a block diagram showing a semiconductor chip in a fourth embodiment of the invention.

FIG. 7 is a block diagram showing a semiconductor chip in a fourth embodiment of the invention. In the embodiment shown in FIG. 5, VDC circuit 15 is provided within semiconductor chip 1 to obtain output voltage VDDQ by decreasing external voltage VDD. In contrast, in the fourth embodiment shown in FIG. 7, a VSSQ generating circuit 16 connected to the line of ground voltage VSS is provided in semiconductor chip 1 and its output voltage VSSQ is supplied to output circuit 12.

Figure 8:
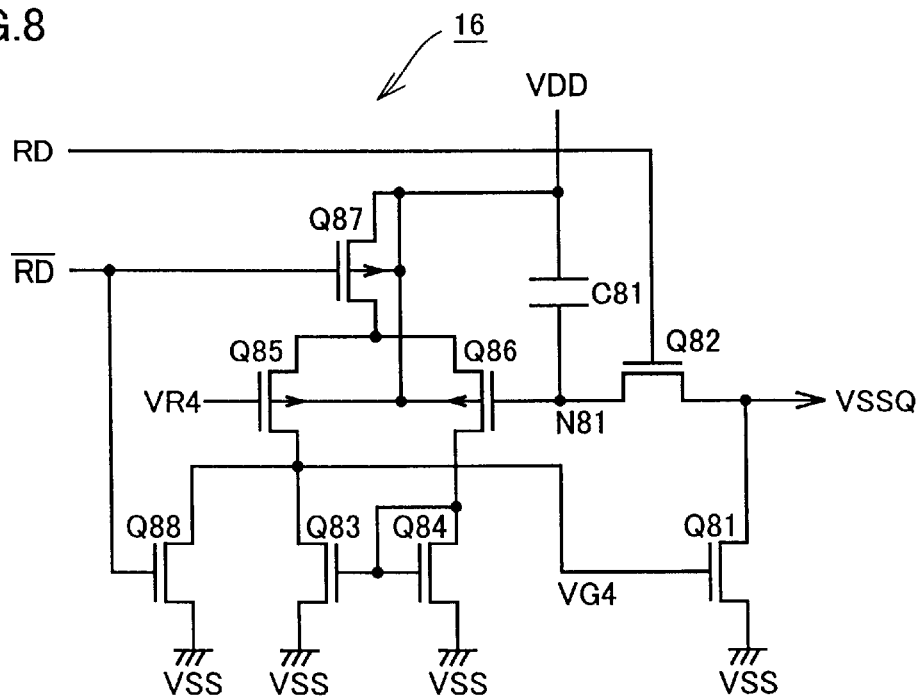
FIG. 8 is a concrete circuit diagram of a VSSQ generating circuit 16 shown in FIG. 7.

FIG. 8 is a concrete circuit diagram of VSSQ generating circuit 16 shown in FIG. 7. In FIG. 8, external voltage VDD is applied to one end of a capacitor C81 and the source of a PMOS transistor Q87. External voltage VDD is applied as a substrate potential to PMOS transistors Q85, Q86, and Q87. A differential amplifier is constructed by NMOS transistors Q83 and Q84 and PMOS transistors Q85, Q86, and Q87. Specifically, the drain of PMOS transistor Q87 is connected to the sources of PMOS transistors Q85 and Q86, and the drain of PMOS transistor Q85 is connected to the drains of NMOS transistor Q83 and an NMOS transistor Q88 and the gate of an NMOS transistor Q81 as a drive transistor.

The drain of PMOS transistor Q86 is connected to the drain of NMOS transistor Q84 and the gates of NMOS transistors Q83 and Q84. A reference voltage VR4 is applied to the gate of PMOS transistor Q85 and the inversion signal of read signal RD is supplied to the gate of each of PMOS transistors Q87 and Q88. The gate of PMOS transistor Q86 is connected to the drain of an NMOS transistor Q82 and the other end of capacitor C81. The source of NMOS transistor Q82 is connected to the drain of NMOS transistor Q81 and outputs output voltage VSSQ. The source of each of NMOS transistors Q81, Q83, Q84, and Q88 is grounded.

The operation of VSSQ generating circuit 16 shown in FIG. 8 will now be described. Predetermined reference voltage VR4 and output voltage VSSQ are compared with each other by the differential amplifier constructed by PMOS transistors Q85 to Q87 and NMOS transistors Q83 and Q84. When output voltage VSSQ increases, gate voltage VG4 of NMOS transistor Q81 is raised. When output voltage VSSQ decreases, gate voltage VG4 is decreased. In such a manner, a feedback control for maintaining the original potential at which output voltage VSSQ is always equal to reference voltage VR4 is performed.

As described above, in the embodiment, by supplying output voltage VSSQ from VSSQ generating circuit 16 to output circuit 12, without adding an external VSSQ terminal dedicated to output circuit 12, VSS noise caused in association with the operation of output circuit 12 can be absorbed by the voltage retaining characteristic of VSSQ generating circuit 16, and a voltage higher than ground voltage VSS of semiconductor chip 1 body can be supplied to output circuit 12. Thus, a small-amplitude and high-speed interface can be realized.

Although not shown, by using both VDC circuit 15 shown in FIG. 6 and VSSQ generating circuit 16 shown in FIG. 8, VDDQ and VSSQ are generated and supplied to output circuit 12. Consequently, without adding a power terminal and a VSS terminal dedicated to the output circuit, power source noise and VSS noise caused in association with operation of output circuit 12 can be absorbed by the voltage retaining characteristic of VDC circuit 15 and VSSQ generating circuit 16, and a voltage lower than source voltage VDD of semiconductor chip 1 body and a voltage higher than ground voltage can be supplied to output circuit 12. Thus, the small-amplitude and high-speed interface can be realized.

Figure 9:
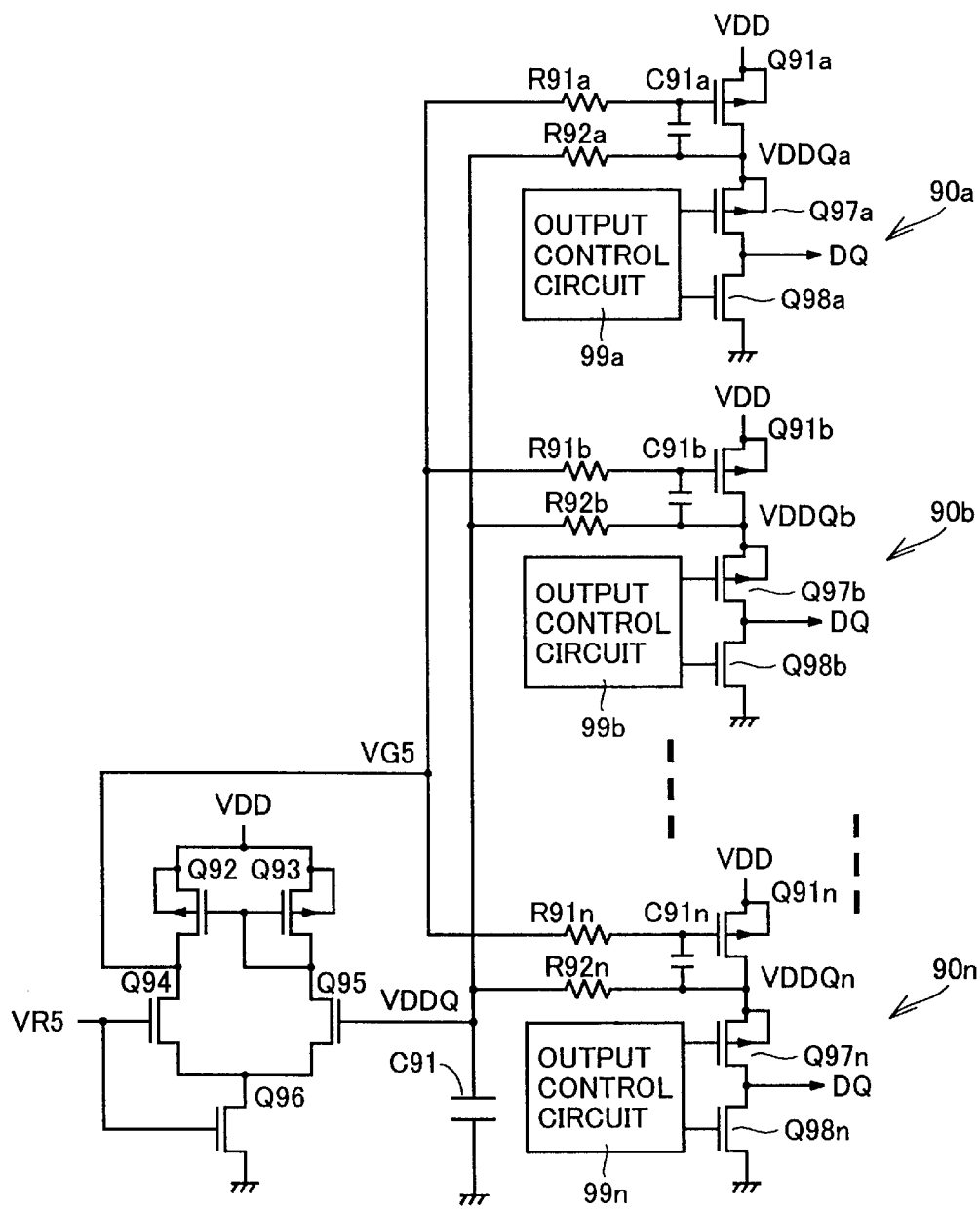
FIG. 9 is a circuit diagram showing the configuration of a VDC circuit and an output circuit in a fifth embodiment of the invention.

FIG. 9 is a circuit diagram showing a VDC circuit and an output circuit in a fifth embodiment of the invention. In the embodiment, the configuration of a semiconductor chip is the same as that of FIG. 5 in the third embodiment but the fifth embodiment is different from the third embodiment with respect to the point that a plurality of output circuits 90a, 90b, . . . and 90n on the same semiconductor chip are provided so as to be separated from each other.

By PMOS transistors Q92 and Q93 and NMOS transistors Q94 to Q96, a differential amplifier similar to that constructed by PMOS transistors Q63 and Q64 and NMOS transistors Q65 to Q67 shown in FIG. 6 is constructed. PMOS transistors Q91a, Q91b, . . . and Q91n as drive transistors are provided for output circuits 90a, 90b, . . . , and 90n, respectively. A gate voltage VG5 as an output of the differential amplifier is applied to the gates of PMOS transistors Q91a, Q91b, ..., and Q91n via resistors R91a, R91b, ... and R91n, respectively. Output voltages VDDQa, VDDQb, ... and VDDQn of drive transistors Q91a, Q91b, ..., and Q91n are given to one of inputs of the differential amplifier via resistors R92a, R92b, ... and R92n, respectively, and a reference voltage VR5 is applied to the other input. A capacitor C91 is connected between one of the inputs of the differential amplifier and the ground line.

Between the gates and drains of drive transistors Q91a, Q91b, ... and Q91n, capacitors C91a, C91b, ..., and C91n as feedback capacitors are connected and coupled so as to pass AC. Resistors R91a, R91b, ..., and R91n are separation resistors for limiting coupling by capacitors C91a, C91b, ..., and C91 to very close transistors. Resistors R92a, R92b, ..., and R92n are separation resistors for returning DC components within changes in output voltages VDDQa, VDDb, ..., and VDDQn.

Output circuits 90a, 90b, ..., and 90n are constructed by output control circuits 99a, 99b, ..., and 99n, PMOS transistors 97a, 97b, ..., and 97n, and NMOS transistors 98a, 98b, ..., and 98n operating complementarily with PMOS transistors 97a, 97b, ..., and 97n, respectively. Output voltages VDDQa, VDDQb, ..., and VDDQn are applied to the sources of PMOS transistors Q97a, Q97b, ..., and Q97n, respectively.

Improvement in operation of the VDC circuit by capacitive coupling shown in FIG. 9 is disclosed in Japanese Patent Bulletin No. 3,085,562. Specifically, for example, when PMOS transistor Q97a performs switching operation at high speed in response to a control signal from output control circuit 99a, a load current flows from PMOS transistor Q91a to PMOS transistor Q97a. Due to the change in the load current, output voltage VDDQ drops rapidly, and the voltage drop is transmitted to PMOS transistor Q91a via capacitor C91a.

By the capacitive coupling of capacitor C91a, gate voltage VG5 drops at high speed, and it makes a current amount supplied by PMOS transistor Q91a increase. That is, the voltage drop in output voltage VDDQ is instantaneously transmitted to the gate of PMOS transistor Q91a without delay, the amount of current passing through PMOS transistor Q91a is increased without delay, and output voltage VDDQ increases. On the contrary, when output voltage VDDQ increases by the current from PMOS transistor Q91a, the increase in output voltage VDDQ is transmitted again to the gate of PMOS transistor Q91a via capacitor C91a, and the current supply amount of PMOS transistor Q91a decreases.

As described above, by capacitor C91a as a feedback capacitor, a potential fluctuation in output voltage VDDQ is transmitted to the gate of PMOS transistor Q91a without delay, so that a higher response as compared with the control by the differential amplifier is realized in transition of the operation of the VDC circuit. At the time of a response in transition, therefore, output voltage VDDQ is returned to a predetermined voltage level by capacitor C91a. Consequently, the control by the differential amplifier whose response is delayed in the transition operation is ignored.

As described above, in FIG. 9, by providing PMOS transistors Q91a, Q91b, ..., and Q91n as drive transistors in correspondence with output circuits 90a, 90b, ..., and 90n, respectively, power source noise caused in association with the operation of each of output circuits 90a, 90b, ..., and 90n does not exert an influence on the power sources of other output circuits but is processed by each of corresponding drive transistors.

By employing such a configuration, without adding an external power terminal dedicated to an output circuit, the power source noise caused in association with the operation of each of output circuits 90a, 90b, ..., and 90n is absorbed by the voltage retaining characteristic of each of the drive transistors constructing the VDC circuit, and the voltage can be supplied not only to the semiconductor chip body but also to the other output circuits. Thus, the small-amplitude and ultra-high-speed interface can be realized.

Although not shown, it is also possible to provide VSSQ generating circuit 16 used on the VSS side as in the fourth embodiment shown in FIG. 8 for each output circuit by using a plurality of drive transistors in a manner similar to the fifth embodiment, thereby preventing interference of outputs of VSS noises.

Further, by using both the VDC circuit for each output circuit shown in this embodiment and the VSSQ generating circuit for each output circuit and generating and supplying VDDQ and VSSQ to each output circuit, without adding a power terminal and a VSS terminal dedicated to the output circuits, power source noise and VSS noise caused in association with the operation of each output circuit are absorbed by the voltage retaining characteristic of each of the drive transistors constructing the VDC circuit and VSSQ generating circuit, an influence on not only the semiconductor chip body but also other output circuits is reduced, and a voltage lower than the source voltage of the semiconductor chip body and a voltage higher than the ground voltage can be supplied to the output circuits. Thus, the small-amplitude and ultra-high-speed interface can be realized.

Figure 10:
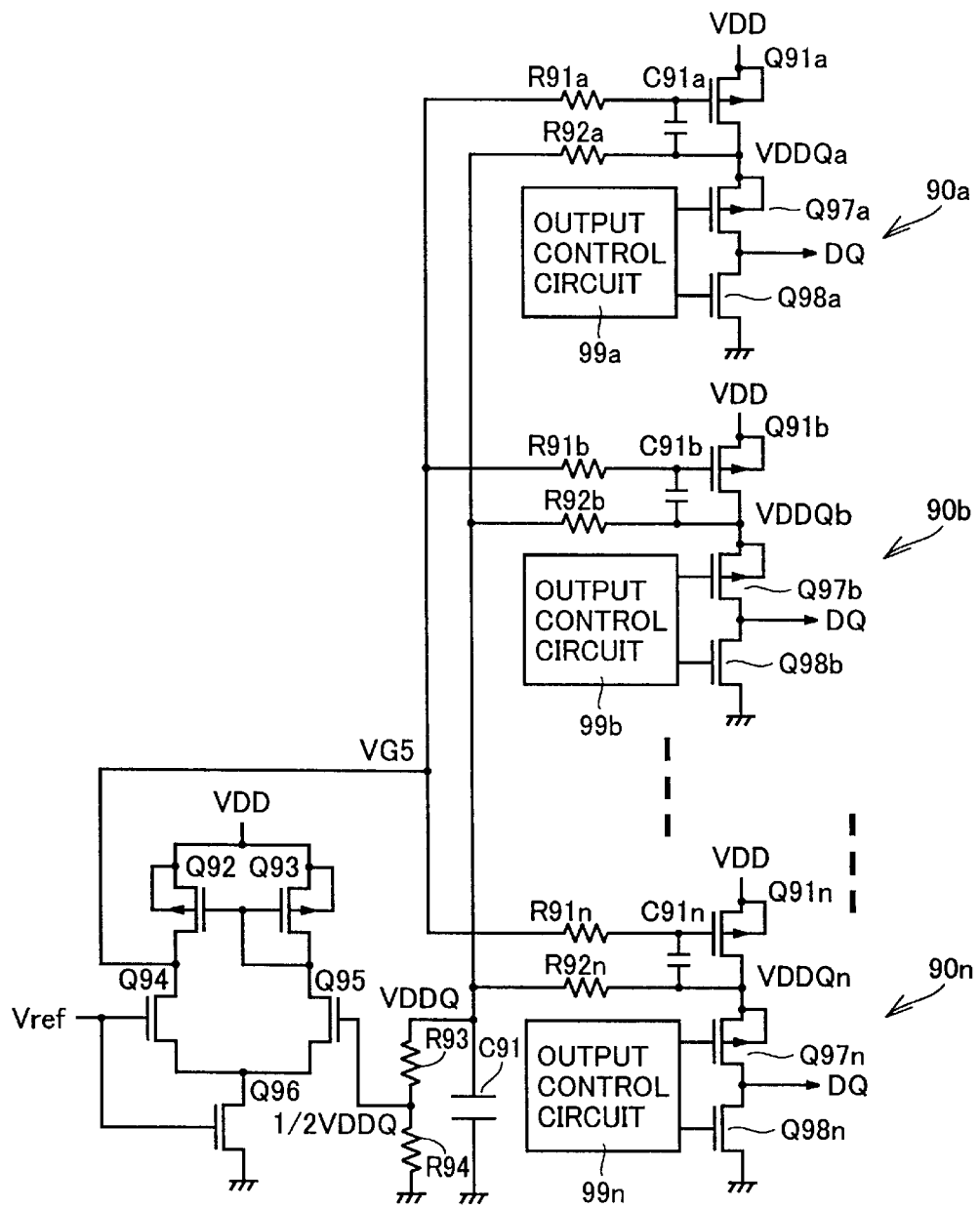
FIG. 10 is a circuit diagram showing the configuration of a VDC circuit and an output circuit in a sixth embodiment of the invention.

FIG. 10 is a circuit diagram showing the configuration of a VDC circuit and an output circuit in a sixth embodiment of the invention. In the embodiment, an input voltage of the differential amplifier in the fifth embodiment shown in FIG. 9 is set to a reference voltage Vref to be supplied to an input circuit of a semiconductor chip and a voltage=½(VDDQ+VSSQ), thereby equalizing the input and output voltages. Specifically, in the foregoing third, fourth, and fifth embodiments, the reference voltage has to be applied to determine output voltage VDDQ or VSSQ. In the sixth embodiment, on the assumption that the central value (Vref) of an input amplitude of the semiconductor chip and the central value (½(VDDQ+VSSQ)) of an output amplitude are equal to each other, setting of a reference voltage VR is omitted. To set the voltage of ½(VDDQ+VSSQ), output voltage VDDQ is divided by voltage dividing resistors R93 and R94, and the voltage of ½(VDDQ+VSSQ) is applied to the gate of NMOS transistor Q95 as a component of the differential amplifier. The other configuration is the same as that of FIG. 9.

Figure 11:
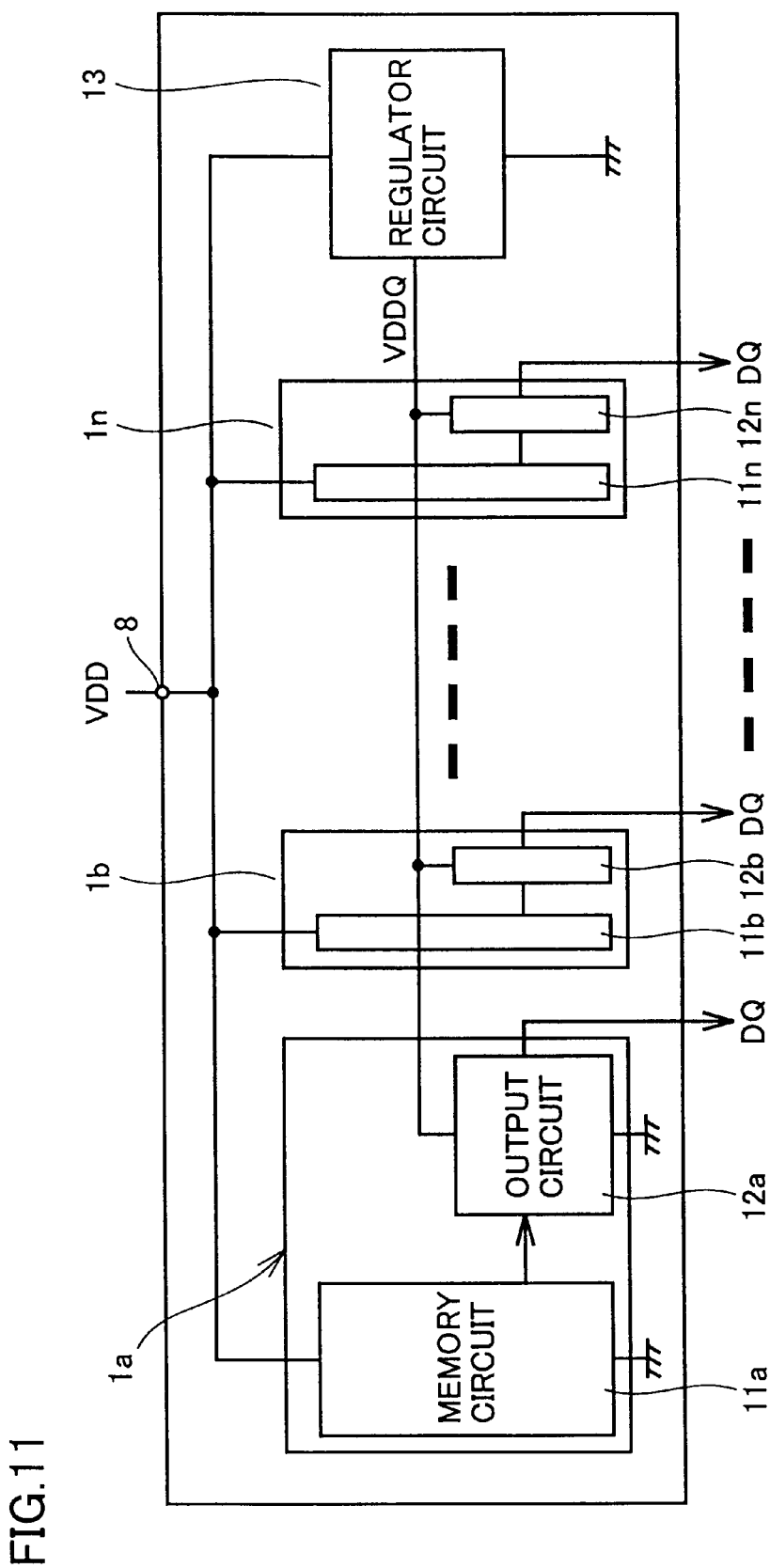
FIG. 11 is a block diagram showing the configuration of a semiconductor memory module in a seventh embodiment of the invention.

FIG. 11 is a block diagram showing the configuration of a semiconductor memory module in a seventh embodiment of the invention. In the seventh embodiment, semiconductor chips 1a, 1b, ..., and 1n and regulator circuit 13 are disposed in a semiconductor memory module. Semiconductor chips 1a, 1b, ..., and 1n are constructed by memory circuits 11a, 11b, ..., and 11n and output circuits 12a, 12b, ..., and 12n, respectively.

In the seventh embodiment, different from the foregoing embodiments, regulator circuit 13 is disposed on the outside of semiconductor chips 1a, 1b, ..., and 1n, so that each of semiconductor chips 1a, 1b, ..., and 1n has to have a power terminal dedicated to the output circuit. However, considering a case such that an entire memory module is mounted as a one semiconductor device on a system, no power terminal dedicated to the output circuit is necessary.

Consequently, the power source noise caused in association with the operation of output circuits 12a, 12b, ..., and 12b can be absorbed by the characteristic as described in the foregoing embodiments, that is, regulator circuit 13. Moreover, a voltage lower than the source voltage of semiconductor chips 1a, 1b, ..., and 1n can be supplied to output circuits 12a, 12b, ..., and 12n, so that a small-amplitude and high-speed interface can be realized in this embodiment as well.

Figure 12:
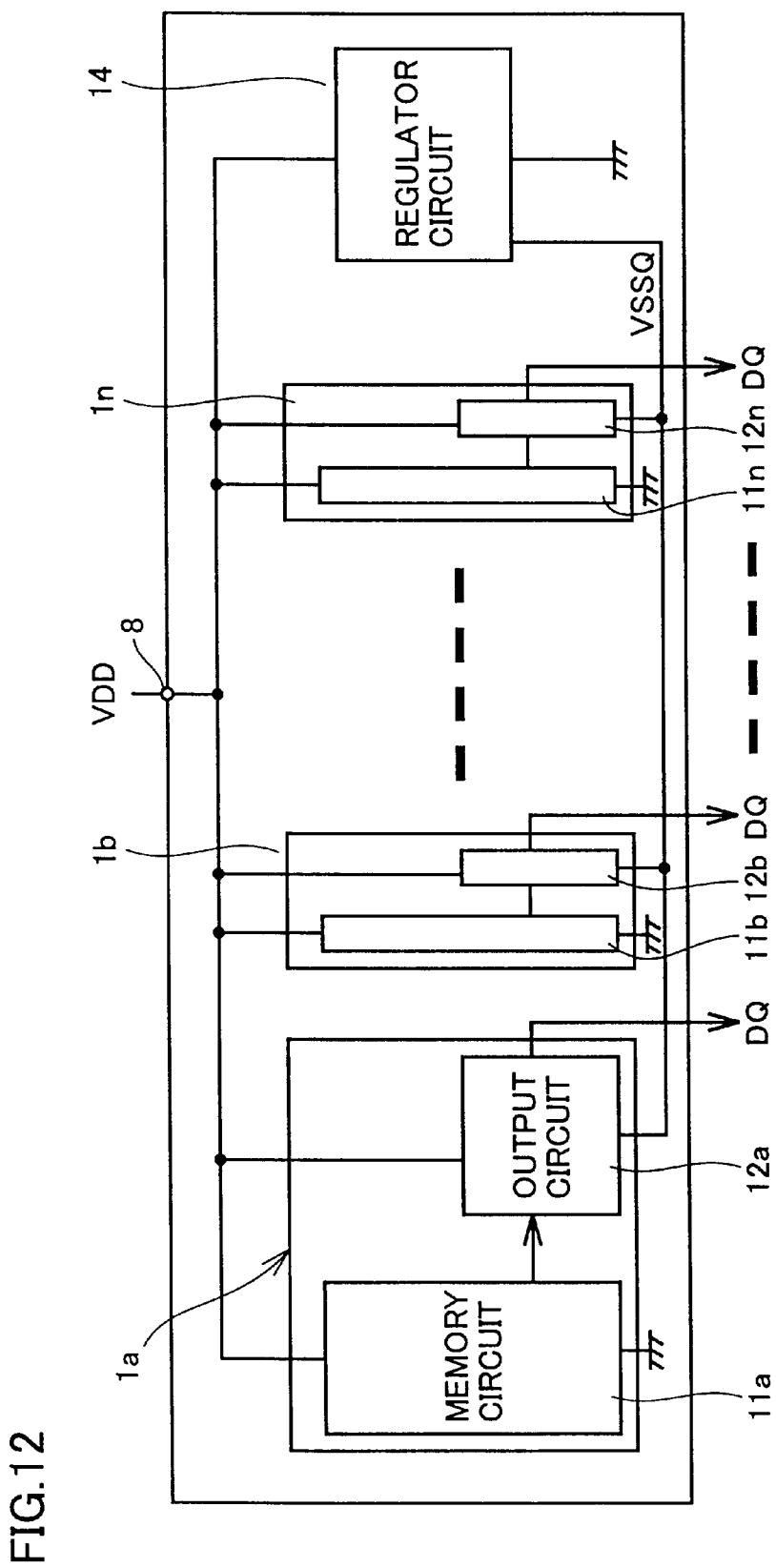
FIG. 12 is a block diagram showing the configuration of a semiconductor memory module in an eighth embodiment of the invention.
Figure 13:
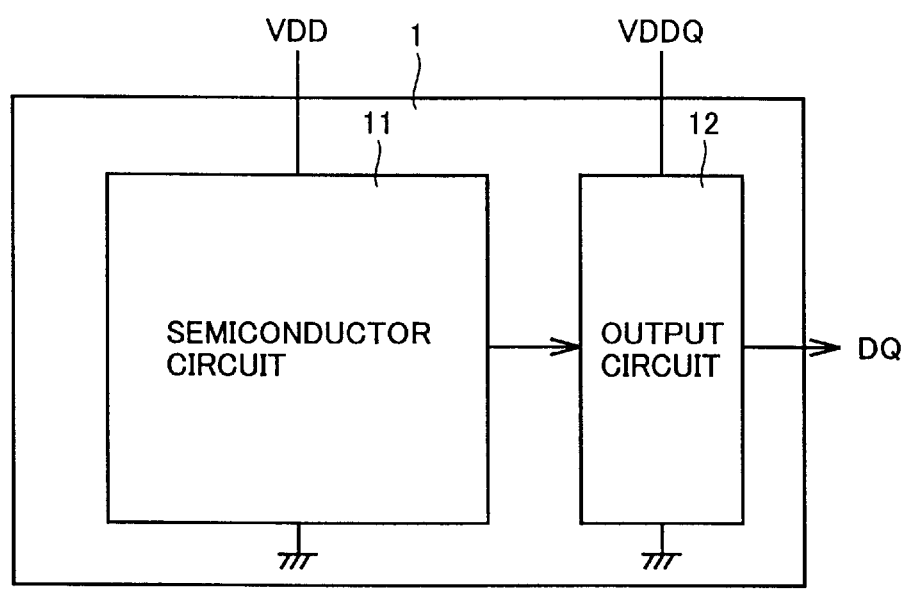
FIG. 13 is a schematic block diagram of a conventional semiconductor chip.

FIG. 12 is a block diagram showing the configuration of a semiconductor memory module in the eighth embodiment of the invention. In the embodiment, in place of regulator circuit 13 for outputting output voltage VDDQ shown in FIG. 11, regulator circuit 14 shown in FIGS. 3 and 4 is provided and ground voltage VSSQ is supplied to each of semiconductor chips 1a, 1b, ..., and 1n. In this embodiment as well, the VSS noise caused in association with the operation of output circuits 12a, 12b, ..., and 12n can be absorbed by regulator circuit 14. Moreover, ground voltage VSSQ higher than ground voltage VSS of semiconductor chips 1a, 1b, ..., and 1n can be supplied to output circuits 12a, 12b, ..., and 12n. Thus, the small-amplitude and high-speed interface can be realized.

In the embodiments shown in FIGS. 11 and 12, in a manner similar to the first and second embodiments, the example in which regulator circuit 13 is disposed on the power source side or regulator circuit 14 is disposed on the ground side has been described. However, the invention is not limited to the configurations. In place of regulator circuit 13 or 14, VDC circuit 15 shown in FIG. 5 or VSSQ generating circuit 16 shown in FIG. 7 may be used. Further, as described in the fifth embodiment shown in FIG. 9, also by distributing drive transistors to semiconductor chips, similar effects can be produced.

As described above, according to the embodiments of the invention, the output voltage obtained by decreasing the source voltage supplied from the outside to the power terminal is divided, the resultant voltage and the output voltage are compared with each other, and the output voltage is set to a predetermined source potential higher than the source voltage supplied from the outside by controlling the on-state resistance of the transistor and supplied to the output circuit. Consequently, without adding an external power terminal dedicated to the output circuit, power source noise caused in association with the operation of the output circuit can be absorbed by the power circuit, and the small-amplitude and high-speed interface can be therefore realized.

A voltage between the source voltage supplied from the outside to the power terminal and the ground potential connected to the external ground potential is divided, the resultant voltage and an output ground potential are compared with each other, and the output ground potential is set to a predetermined ground potential higher than the external ground potential by controlling the on-state resistance of the transistor and supplied to the output circuit. Thus, without adding an external ground terminal dedicated to the output circuit, ground potential noise caused in association with the operation of the output circuit can be absorbed by the power source circuit, and the small-amplitude and high-speed interface can be therefore realized.

Further, a power terminal to which a source voltage to be applied to a semiconductor circuit is supplied from the outside and a drive transistor for comparing an output potential supplied to an output circuit with a predetermined reference potential and, according to a comparison output, controlling the output potential to be a predetermined potential lower than the source voltage applied from the outside to the power terminal are provided. Therefore, without adding an external power source terminal dedicated to the output circuit, power source noise caused in association with the operation of the output circuit can be absorbed by the voltage retaining characteristic of a power circuit, and a voltage lower than the source voltage of the semiconductor chip body can be supplied to the output circuit. Thus, the small-amplitude and high-speed interface can be realized.

Further, an output ground potential to be supplied to an output circuit is compared with a predetermined reference potential and, according to a comparison output, a drive transistor is controlled so that the output ground potential becomes a predetermined potential higher than the ground potential of a ground terminal. Therefore, without adding an external ground terminal dedicated to the output circuit, ground potential noise caused in association with the operation of the output circuit can be absorbed by a voltage retaining characteristic of a power circuit, and a voltage higher than the ground voltage of the semiconductor chip body can be supplied to the output circuit. Thus, the small-amplitude and high-speed interface can be realized.

Further, a switching transistor is switched in accordance with an active signal supplied from a semiconductor circuit and a potential lower than a power source potential from a power circuit or a potential higher than an external ground potential is supplied to an output circuit, so that a leak current can be prevented from flowing from the power circuit into the output circuit when the active signal is inactive.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including an output circuit, comprising:
   a semiconductor circuit for supplying an output control signal to said output circuit;
   a first power terminal to which a first source potential to be applied to said semiconductor circuit is supplied from the outside;
   a second power terminal to which a second source potential to be applied to said semiconductor circuits is supplied from the outside; and
   a power circuit supplying to said output circuit a prescribed power supply potential obtained by shifting said first power supply potential toward said second power supply potential;
   said power circuit including a transistor for control, dividing the voltage between an output potential and said second power supply potential, controlling on-state resistance of said transistor by using a potential difference between the potential obtained by the dividing operation and said output potential, and outputting the predetermined power supply potential.

2. The semiconductor device according to claim 1, wherein said power circuit includes a switching transistor for supplying the predetermined source potential obtained by shifting said first power supply potential toward said second power supply potential to said output circuit in accordance with an active signal supplied from said semiconductor circuit.

3. The semiconductor device according to claim 1, wherein a plurality of semiconductor chips each including said semiconductor circuit and said output circuit are arranged, and said power circuit is provided commonly for said plurality of semiconductor chips.

4. The semiconductor device according to claim 1, wherein said first source potential is VDD, and said second source potential is VSS.

5. The semiconductor device according to claim 1, wherein said first source potential is VSS, and said second source potential is VDD.

6. A semiconductor device including an output circuit, comprising:

a semiconductor circuit for supplying an output control signal to said output circuit;

a power terminal to which a source voltage to be applied to said semiconductor circuit is supplied from the outside; and a power circuit including a comparing circuit for comparing an output potential to be applied to said output circuit with a predetermined reference potential; and a drive transistor for controlling said output potential to be a predetermined source potential lower than said source voltage applied to said power terminal in accordance with a comparison output of said comparing circuit.

7. The semiconductor device according to claim 6, wherein said power circuit includes a switching transistor for supplying the predetermined source potential lower than said source voltage to said output circuit in accordance with an active signal supplied from said semiconductor circuit.

8. The semiconductor device according to claim 6, wherein a plurality of semiconductor chips each including said semiconductor circuit and said output circuit are arranged, and said power circuit is provided commonly for said plurality of semiconductor chips.

9. The semiconductor device according to claim 6, wherein a plurality of said output circuits are provided, and the drive transistor of said power circuit is provided in correspondence with each of the output circuits.

10. The semiconductor device according to claim 9, wherein said comparison output is supplied to an input electrode of said drive transistor, said source voltage is applied to a first electrode of said drive transistor, and said output voltage is output from a second electrode of said drive transistor and applied to said output circuit, and the semiconductor device further comprises:

a feedback capacitor connected between the input electrode and the second electrode of said drive transistor;

a first resistor connected between the input electrode of said drive transistor and said comparison output; and a second resistor connected between the second electrode of said drive transistor and a comparison input of said comparing circuit.

11. The semiconductor device according to claim 6, wherein as said reference potential, a reference potential for an input signal is used.

12. The semiconductor device according to claim 6, further comprising a voltage dividing resistor for dividing a signal to be supplied to a comparison input of said comparing circuit.

13. A semiconductor device including an output circuit, comprising:

a semiconductor circuit for supplying an output control signal to said output circuit;

a power terminal to which a source voltage to be applied to said semiconductor circuit and said output circuit is supplied from the outside;

a ground terminal connected to an external ground potential; and a power circuit including a comparing circuit for comparing an output ground potential to be applied to said output circuit with a predetermined reference potential, and a drive transistor for controlling said output ground potential to be a predetermined potential higher than a ground potential of said ground terminal in accordance with a comparison output of said comparing circuit.

14. The semiconductor device according to claim 13, wherein said power circuit includes a switching transistor for supplying a predetermined ground potential higher than the ground potential of said ground terminal to said output circuit in accordance with an active signal supplied from said semiconductor circuit.

15. The semiconductor device according to claim 13, wherein a plurality of semiconductor chips each including said semiconductor circuit and said output circuit are arranged, and said power circuit is provided commonly for said plurality of semiconductor chips.

16. The semiconductor device according to claim 13, wherein a plurality of said output circuits are provided, and the drive transistor of said power circuit is provided in correspondence with each of the output circuits.

17. The semiconductor device according to claim 16, wherein said comparison output is supplied to an input electrode of said drive transistor, said source voltage is applied to a first electrode of said drive transistor, and said output voltage is output from a second electrode of said drive transistor and applied to said output circuit, and the semiconductor device further comprises:

a feedback capacitor connected between the input electrode and the second electrode of said drive transistor;

a first resistor connected between the input electrode of said drive transistor and said comparison output; and a second resistor connected between the second electrode of said drive transistor and a comparison input of said comparing circuit.

18. The semiconductor device according to claim 13, further comprising a voltage dividing resistor for dividing a signal to be supplied to a comparison input of said comparing circuit.

19. The semiconductor device according to claim 13, wherein as said reference potential, a reference potential for an input signal used.

* * * * *